United States Patent [19]

Wolk et al.

[11] Patent Number: 5,685,939
[45] Date of Patent: Nov. 11, 1997

[54] PROCESS FOR MAKING A Z-AXIS ADHESIVE AND ESTABLISHING ELECTRICAL INTERCONNECTION THEREWITH

[75] Inventors: Martin B. Wolk, Woodbury; Thomas A. Isberg, Apple Valley; Michael A. Kropp, Cottage Grove; William V. Dower; Joel A. Gerber, both of St. Paul, all of Minn.

[73] Assignee: Minnesota Mining and Manufacturing Company, St. Paul, Minn.

[21] Appl. No.: 402,028

[22] Filed: Mar. 10, 1995

[51] Int. Cl.$^6$ .................................................. B44C 3/02
[52] U.S. Cl. .................. 156/234; 156/240; 156/272.8; 156/275.7; 156/277
[58] Field of Search ..................... 156/277, 272.2, 156/275.7, 275.1, 379.6, 230, 235, 239, 240, 249, 234, 233, 272.8

[56] References Cited

U.S. PATENT DOCUMENTS

| | | | |
|---|---|---|---|
| 2,822,509 | 2/1958 | Harvey | 317/2 |
| 3,787,210 | 1/1974 | Roberts | 96/27 E |
| 3,962,513 | 6/1976 | Eames | 428/323 |
| 3,964,389 | 6/1976 | Peterson | 101/467 |
| 4,113,981 | 9/1978 | Fujita et al. | 174/88 R |
| 4,244,605 | 1/1981 | Deneau . | |
| 4,374,691 | 2/1983 | Vanden Bergh | 156/275.1 X |
| 4,549,824 | 10/1985 | Sachdev et al. | 400/241.1 |
| 4,606,962 | 8/1986 | Reylek et al. | 428/148 |
| 4,731,282 | 3/1988 | Tsukagoshi et al. | 428/220 |
| 4,735,847 | 4/1988 | Fujiwara et al. | 428/209 |
| 4,740,657 | 4/1988 | Tsukagoshi et al. | 174/88 |
| 4,749,120 | 6/1988 | Hatada | 228/123 |
| 4,853,252 | 8/1989 | Frankel et al. . | |
| 4,859,263 | 8/1989 | Dziurla et al. | 156/234 X |
| 4,869,767 | 9/1989 | Robinson et al. | 156/234 X |
| 4,959,008 | 9/1990 | Wasulko | 156/230 X |
| 5,001,542 | 3/1991 | Tsukagoshi et al. | 357/68 |
| 5,017,547 | 5/1991 | DeBoer | 503/227 |
| 5,087,494 | 2/1992 | Calhoun et al. | 428/40 |
| 5,089,372 | 2/1992 | Kirihata et al. | 430/167 |
| 5,120,665 | 6/1992 | Tsukagoshi et al. | 437/8 |
| 5,156,938 | 10/1992 | Foley et al. | 430/200 |
| 5,171,650 | 12/1992 | Ellis et al. | 430/20 |
| 5,240,761 | 8/1993 | Calhoun et al. | 428/148 |
| 5,256,506 | 10/1993 | Ellis et al. | 430/20 |
| 5,260,761 | 11/1993 | Barker | 356/4.5 |
| 5,275,856 | 1/1994 | Calhoun et al. | 428/40 |
| 5,278,023 | 1/1994 | Bills et al. | 430/201 |
| 5,300,340 | 4/1994 | Calhoun et al. | 428/40 |
| 5,366,140 | 11/1994 | Koskenmaki et al. | 228/246 |

FOREIGN PATENT DOCUMENTS

| | | | |
|---|---|---|---|
| 0 414 140 A3 | 2/1991 | European Pat. Off. | H01L 21/48 |
| 0421709A1 | 4/1991 | European Pat. Off. | 156/233 |
| 0 512546 A1 | 11/1992 | European Pat. Off. | H01B 5/16 |
| 37 41 916 A1 | 6/1989 | Germany . | |
| WO 91/17840 | 11/1991 | WIPO | 156/230 |

OTHER PUBLICATIONS

Jin et al., "Anisotropically Conductive Polymer Films with a Uniform Dispersion of Particles," *IEEE Transactions on Compnents, Hybrids and Mfg. Tech.*, vol.16, No. 8, pp. 972–977 (New York, Dec. 1993).

*Primary Examiner*—David A. Simmons
*Assistant Examiner*—Paul M. Rivard
*Attorney, Agent, or Firm*—Gary L. Griswold; Walter N. Kirn, Jr.; H. Sanders Gwin, Jr.

[57] ABSTRACT

A Z-axis adhesive is produced by dispersing electrically-conductive particles in an organic binder and then imagewise exposing the material to electromagnetic radiation, preferably from a laser or a flash lamp, under conditions sufficient to transfer the particles from the binder to a receptor in a patterned fashion such that the resulting adhesive is a Z-axis conductor in the patterned areas. The patterned adhesive can then be used to establish electrical interconnection between facing electrodes of a number of different structures including semiconductor chips and a flexible printed circuit board.

30 Claims, No Drawings

PROCESS FOR MAKING A Z-AXIS ADHESIVE AND ESTABLISHING ELECTRICAL INTERCONNECTION THEREWITH

FIELD OF THE INVENTION

This invention relates to a process for making a Z-axis adhesive composition by electromagnetic energy-induced transfer of electrically-conductive particles from a donor element to a receptor. This invention also relates to establishing electrical interconnection between facing electrodes by using such a Z-axis adhesive.

BACKGROUND OF THE ART

In the electronic equipment and telecommunications industries there are strenuous requirements for making electrical connection between components, often on a very small scale. Semiconductors, such as integrated circuits, are formed on wafers which are then cut into chips that may be individually mounted on substrates. Typically, the substrate has fine electrically-conductive circuit lines, and electrical and thermal contact must be made between the substrate and chip. As electronic appliances, such as computers, tape players, televisions, and telephones become smaller, thinner, and more portable, the size requirements for semiconductors and the means for providing electrical connection between semiconductors and substrates, or between flexible circuits and rigid printed circuits, becomes increasingly demanding.

Normally, silicon chips are mounted in a package. A package is an electronic component which is suitable for mounting on a printed circuit board by means of a soldering operation. Chips are normally mounted in the package with the active side facing up, and electrical connection to the active side is provided via wire bonding. The idea of flipchip mounting is to eliminate the package and associated wire bonds or other long electrical leads and instead to mount the chip directly on a circuit substrate with the active side facing down. In this manner, the shortest possible interconnection path is provided between the chip and the substrate, and also the lowest possible profile is attained. Great care must be taken to successfully utilize flipchip packaging. The physical properties of the substrate material must be carefully considered as well as such things as chip size and pad layout.

One method for providing electrical conductivity between two electrical elements, such as between flexible circuits and flipchips, is through the use of an anisotropic electrically-conductive adhesive which is electrically-conductive only in the direction perpendicular to the surface thereof and not in any direction parallel to the surface. Such an anisotropic electrically-conductive adhesive is hereinafter known as a Z-axis adhesive. A Z-axis adhesive (e.g., U.S. Pat. Nos. 2,822,509 and 4,606,962) typically consists of conductive particles dispersed throughout an adhesive film. When a Z-axis adhesive is used to bond together arrays of conductive elements on two insulating substrates, contact between the conductive elements is made by the conductive particles. As the demands for miniaturization continue to increase, spacing between particles and precision in spacing between particles becomes increasingly important.

A Z-axis adhesive can be made by randomly dispersing conductive metal particles or metal coated polymeric spheres in an adhesive. See, for example, U.S. Pat. Nos. 4,113,981; 4,731,282; 4,735,847; 4,740,657; 5,001,542; and 5,120,665. By randomly dispersing conductive metal particles in an adhesive, the resulting Z-axis adhesive will have random distances between individual particles, including particles touching each other. In order to provide the desired density for electrical connection of the electrical elements, sufficient particles must be loaded into the adhesive to insure that Z-axis conductivity will occur as required. It is typically necessary to load excess particles so that the maximum random gap between particles does not exceed the spacing requirements for interconnection. The random loading of conductive particles causes clumping of particles which will cause shorting of electrical elements. Therefore, it is important to be able to provide positioned conductive particles. Although electrical contact can sometimes be made with adhesives not containing these particles, particle-loaded adhesives provide better electrical reliability and overcome non-planarity in the substrates.

In the typical usage of a Z-axis adhesive, an adhesive material layer is provided between the confronting circuits and pressure, or heat in combination with pressure is applied to the adhesive layer, causing the facing circuits to be electrically connected, and adjacent circuits to be electrically insulated from one another. The circuits are bonded and fixed in this state. Such adhesives can be either thermosetting or thermoplastic in nature.

Unloaded (i.e., not containing electrically-conductive particles), electrically insulating adhesives can be used to create electrical interconnections in specialized situations. For example, unloaded, electrically insulating adhesives are used for bonding bumped semiconductor chips to a circuit (see, e.g., U.S. Pat. No. 4,749,120). In this flipchip application, the metallic bumps of a semiconductor chip penetrate the adhesive during bonding and provide electrical interconnection through direct contact with the leads on a substrate such as a flexible printed circuit. The use of bumps on the chip, though, increases the manufacturing costs of the bonded chips, a distinct disadvantage in the competitive electronics industry. However, it may sometimes be advantageous to use a Z-axis adhesive to bond bumped chips to obtain more reliable electrical interconnects and improved aging characteristics.

There is a need in the industry to be able to bond unbumped chips in flipchip applications as well. An electrically insulating adhesive typically will not provide adequate electrical contact on chips without bumps. Furthermore, randomly loaded conductive adhesives are also problematic. For example, on chips with small bonding pad sizes (such as 2×2 mils), it is difficult to insure that enough particles per bonding pad are present to obtain stable electrical interconnection between the semiconductor chip and the circuit-containing article to which it is bonded. The problem of inadequate and unstable electrical interconnection typically cannot be overcome simply by adding more electrically-conductive particles. Simply adding more electrically-conductive particles increases the particle density to the point at which electrical conduction in the plane of the adhesive occurs due to continuous particle contact.

It is desirable, therefore, either to provide particles only at pad sites or to provide particles in an array that will insure particles at every pad, but without electrical shorting between pads. Current approaches to such placement of particles involve the use of grid arrays of particles (e.g., see U.S. Pat. Nos. 5,087,494, 5,240,761, 5,275,856, 5,300,340, and 5,366,140).

In one approach (e.g., U.S. Pat. No. 5,087,494), a grid array is embossed on the surface of a flexible carrier web, filled with a plurality of electrically-conductive particles, and overcoated with the adhesive to be used. This grid array insures the presence of electrically-conductive particles on all pads without electrical shorting.

An alternate method of preparing a grid array of conductive particles is described in U.S. Pat. No. 5,240,761. The method consists of initially forming a dense monolayer of conductive particles on an adhesive tape, biaxially stretching the tape to separate each particle from other particles of the monolayer, followed by embedding the particles into an adhesive layer.

Another alternate method of preparing a grid array of conductive particles is described in U.S. Pat. No. 5,366,140. A metal layer on a substrate is partitioned into metal regions. Heat is then applied to melt the metal, forming discrete uniform sized microbeads precisely spaced on the surface of the substrate.

Additional alternatives have been disclosed in the patents discussed above, however, the limitations of all these methods lie in the fact that they require regular grid arrays of conductive particles. The Z-axis adhesive produced by these methods may leave conductive particles beneath the chip in areas where electrical contact is not desired. In addition, conductive particles may be present along the edge of the chip where undesirable electrical contact is frequently encountered as a result of wafer dicing.

New and improved methods of making electrically-conductive adhesives are constantly needed and sought after in the electronics industry. It was against this background that the present invention dealing with the imagewise radiation induced thermal transfer of electrically-conductive particles from a donor element to a receptor was developed. The transfer of electrically-conductive particles is induced by irradiation with electromagnetic energy (e.g., lasers, flash lamps, and the like).

Laser-induced thermal transfer of materials from a donor sheet to a receptor layer has been described in the patent and technical literature for nearly thirty years. However, few commercial systems have utilized this technology. Exposure fluences required to transfer materials to a receptor have been, at best, on the order of 0.1 Joule/cm$^2$ (i.e., J/cm$^2$). Consequently, lasers capable of emitting more than 5 Watts of power, typically water-cooled Nd:YAG lasers, have been required to produce large format images (A3 or larger) in reasonable times. These lasers are expensive and impractical for many applications. More recently, single-mode laser diodes and diode-pumped lasers producing 0.1–4 Watts in the near-infrared region of the electromagnetic spectrum have become commercially available. Diode-pumped Nd:YAG lasers are good examples of this type of source. They are compact, efficient, and relatively inexpensive.

Separately addressed laser diode arrays have been utilized to transfer dyes in color proofing systems. For example, U.S. Pat. No. 5,017,547 describes the binderless transfer of dye from a dye-binder donor sheet to a polymeric receptor sheet. In that process, dye molecules are vaporized or sublimed via laser heating. These molecules traverse the gap between the donor and receptor and recondense on the receiver. The donor and receptor are separated by spacer beads.

Exothermic heat-producing reactions have been used for the thermal transfer of inks. For example, in U.S. Pat. No. 4,549,824 aromatic azido compounds were incorporated into thermal transfer inks. When heated to 170° C., the aromatic azido compound melts the ink and allows it to flow into a receptor, such as plain paper. The heat generated by the decomposition of the aromatic azido compound reduces the amount of heat that must be supplied by the thermal head or laser source, thereby improving the overall imaging throughput. However, the process occurs over a relatively long time scale ($\geq 1$ msec), thereby resulting in significant heat diffusion and heat loss. In addition, pressure between the donor and receptor is required to maintain uniform transfer. An optically transparent means of applying pressure (e.g., a cylindrical lens or a flat glass plate) is difficult to employ in high resolution laser-based imaging systems.

Laser-induced propulsive transfer processes can be used to achieve exposure fluences and pixel dwell times that are substantially less than those of the previously disclosed processes. U.S. Pat. No. 3,787,210 discloses the use of laser induced propulsive transfer to create a positive and negative image on film. A clear substrate was coated with heat-absorbing particles dispersed in a self-oxidizing binder. In that patent, the heat absorber was carbon black and the binder was nitrocellulose. The donor sheet was held in intimate contact with a receptor. When the coating was locally heated with a laser, combustion in the binder was initiated, thus blowing the carbon black onto the receptor. The receptor could be paper, adhesive film, or other media. The self-oxidizing binder was employed to reduce the exposure fluence required to achieve imaging.

In U.S. Pat. No. 3,964,389 crosslinkable resins were added to a carbon black/nitrocellulose coating and the material was transferred to aluminum by imagewise heating with a laser. The resin was thermally crosslinked on the aluminum to produce a lithographic printing plate.

U.S. Pat. No. 3,962,513 discloses the use of a dual-layer coating construction for the production of lithographic printing plates. The first layer was a coating of carbon black and nitrocellulose binder coated on top of a clear substrate. An overlying layer of crosslinkable, ink-receptive resin was coated over this propellant layer. Upon laser heating, the resin was transferred to an aluminum plate. The run length and the image sharpness of the resulting plate were improved with this construction. That patent discusses the advantages of placing the propellant in a separate layer below the material to be transferred. Unlike the single layer case, the expansion of gas serves to propel the transfer material from behind, thus achieving forward propulsion of the transfer material toward the paper and minimal lateral dispersion.

The use of decomposable polymers for color proofing applications is disclosed in U.S. Pat. No. 5,156,938. A single layer containing pigment, infrared dye, acid initiator, and polymeric binder was coated on a transparent substrate. Upon heating with a Nd:YAG laser, an acid was produced that rapidly decomposed the polymer to produce gas. An exposure energy of 0.1 J/cm$^2$ was required to transfer this material. The gas serves to propel the pigment to a receiver such as plain paper, but that construction does not provide the flexibility to transfer many types of materials due to the compatibility of the components in the single layer construction.

U.S. Pat. Nos. 5,171,650 and 5,256,506 disclose methods and materials for thermal imaging using an "ablation-transfer" technique. The donor element for that imaging process comprises a support, an intermediate dynamic release layer, and an ablative carrier topcoat. The topcoat carries the colorant. The dynamic release layer may also contain infrared-absorbing (light to heat conversion) dyes or pigments. The addition of electrically-conductive material (e.g., conductive dispersions of graphite, silver, aluminum, and copper) to the topcoat to be transferred to an insulating surface was mentioned as being useful in the production of printed circuits. No suggestion was made for the use of this process in the preparation of Z-axis adhesives.

U.S. Pat. No. 5,089,372 discloses transfer recording media comprising a substrate having sequentially coated thereon a layer of a photolyzable compound (e.g., aromatic diazo and azide compounds) and a solid ink layer.

U.S. Pat. No. 5,278,023 discloses laser-addressable thermal transfer materials for producing color proofs, printing plates, films, printed circuit boards, and other media. The propellant contains a substrate coated thereon with a propellant layer wherein the propellant layer contains a material capable of producing nitrogen ($N_2$) gas; a radiation-absorber; and a thermal mass transfer material. The thermal mass transfer material may be incorporated into the propellant layer or in an additional layer coated onto the propellant layer. The radiation-absorber may be employed in one of the above-disclosed layers or in a separate layer in order to achieve localized heating with an electromagnetic energy source, such as a laser. Upon laser induced-heating, the transfer material is propelled to the receptor by the rapid expansion of gas. The thermal mass transfer material may contain, for example, pigments, toner particles, resins, metal particles, monomers, polymers, dyes, or combinations thereof.

So far as it is known, before the present invention the imagewise radiation induced thermal transfer of electrically-conductive particles from a donor element to a receptor induced by exposure to a source of electromagnetic energy, such as by a laser or a flash lamp, to create a Z-axis adhesive has not been disclosed in the literature or known or practiced in the industry.

SUMMARY OF THE INVENTION

The present invention involves the imagewise radiation induced thermal transfer of electrically-conductive particles from a donor element, comprising a substrate having thereon, a layer comprising electrically-conductive particles dispersed in an organic binder, to a receptor, and provides an improvement in the production of patterned Z-axis adhesives.

In one embodiment of the present invention, there is provided a process for the preparation of patterned Z-axis adhesives comprising the steps of: (a) providing a donor element comprising a substrate having coated thereon a layer comprising electrically-conductive particles dispersed in an organic binder; (b) placing the donor element in intimate contact with an adhesive receptor; and (c) imagewise exposing the donor element to electromagnetic radiation under conditions sufficient to thermally transfer the layer containing the electrically-conductive particles from the donor element to the adhesive receptor in a patterned fashion.

In an alternative embodiment of the present invention, there is provided a process for the preparation of patterned Z-axis adhesives comprising the steps of: (a) providing a donor element comprising a substrate having coated thereon a layer comprising electrically-conductive particles dispersed in an organic binder; (b) placing the donor element in intimate contact with a receptor; (c) imagewise exposing the donor element to electromagnetic radiation under conditions sufficient to thermally transfer the layer containing the electrically-conductive particles from the donor element to the receptor in a patterned fashion; and (d) applying an adhesive layer to the surface of the receptor bearing the conductive particles.

In another embodiment of the present invention, there is provided a process for establishing electrical interconnection between two electrode containing materials using a patterned Z-axis conductive adhesive comprising the steps of: (a) providing a donor element comprising a substrate having coated thereon a layer comprising electrically-conductive particles dispersed in an organic binder; (b) placing the donor element in intimate contact with an adhesive receptor; (c) imagewise exposing the donor element to electromagnetic radiation under conditions sufficient to transfer the electrically-conductive particles from the donor element to the adhesive receptor in a patterned fashion; and (d) bonding together a first and a second electrode-containing material with the adhesive.

In yet another embodiment of the present invention, there is provided a process for establishing electrical interconnection between two electrode containing materials using a patterned Z-axis conductive adhesive comprising the steps of: (a) providing a donor element comprising a substrate having coated thereon a layer comprising electrically-conductive particles dispersed in an organic binder; (b) placing the donor element in intimate contact with a receptor; (c) imagewise exposing the donor element to electromagnetic radiation under conditions sufficient to thermally transfer the electrically-conductive particles from the donor element to the receptor in a patterned fashion; (d) applying an adhesive layer to the surface of the receptor bearing the conductive particles; and (e) bonding together a first and a second electrode-containing material with the adhesive.

In a preferred embodiment, the source of electromagnetic energy used to induce the thermal transfer of the electrically-conductive particles to the receptor is either a laser or a flash lamp. If a laser is used, it is preferred that the binder is chemically similar to the adhesive to which the transfer will occur. If a flash lamp is used, it is preferred that a gas-producing polymer be used as a binder.

The present invention provides an improved process for making and using Z-axis adhesives which are capable of establishing electrical continuity between facing electrodes while maintaining electrical insulation laterally between adjacent electrodes. A typical use for such an adhesive is to provide electrical connection between a flexible printed circuit and a flat panel display. Other potential applications include flipchip attachment of unpackaged silicon chips to various printed circuit substrates and providing electrical interconnection between two flexible printed circuits.

The improved and simplified inventive process by which the patterned Z-axis adhesive can be produced is via radiation induced thermal imaging. Radiation induced thermal transfer of ultrafine particles from a donor sheet to a receptor is a one step, dry, high resolution process. The thermal transfer can be induced by flash lamp exposure or laser exposure during which the particles and/or additional light-to-heat converters (e.g., radiation absorbing dyes) absorb the incident radiation and heat the surrounding medium until transfer occurs. In a preferred case, a digital process is used to control a laser used to induce the transfer of the electrically-conductive particles to the receptor. The flexibility of the digitally-controlled laser-induced transfer process allows different chip designs to be easily accommodated in the same production flow. In addition, the process is compatible with web processing techniques for mass production of Z-axis adhesive.

Other aspects, advantages, and benefits of the present invention will be apparent from the detailed description, the examples, and the claims. As used herein:

"flash lamp" means a device that can convert stored electrical energy into light by means of a sudden electrical discharge;

"light to heat converter" means a substance which absorbs incident electromagnetic radiation and efficiently transforms it to thermal energy;

"black body absorber" means any material that has significant absorptions in the UV, visible, and near infrared regions of the spectrum;

"ablation" refers to the transfer of material in a thermal imaging process by the action of a thermal source, through rapid removal of material from the surface, but without sublimation of the material, inclusive of processes commonly called "ablation transfer" and "melt-stick transfer";

"imagewise exposure" is the process by which a sample is subjected to irradiation in such a manner that only selected areas are irradiated. The selected areas constitute a pattern of intelligence which may be distributed digitally (i.e. modulation of a laser beam) or in an analog fashion (i.e., a mask);

"particle size" means the average diameter of a collection of particles;

"group" refers to not only pure hydrocarbon chains or structures such as methyl, ethyl, cyclohexyl, and the like, but also to chains or structures bearing conventional substituents in the art such as hydroxy, alkoxy, phenyl, halo (F, Cl, Br, I), cyano, nitro, amino, etc.;

"radical" refers to the inclusion of only pure hydrocarbon chains such as methyl, ethyl, propyl, cyclohexyl, isooctyl, tert-butyl, and the like;

"thermally available nitrogen content" refers to the nitrogen content (weight percentage basis) of a material which upon exposure to heat (preferably less than about 300° C. and more preferably less than about 250° C.) generates or liberates nitrogen ($N_2$) gas; and "thermally decomposable nitrogen-containing group" refers to a nitrogen-containing group (e.g., azido, nitrate, nitro, triazole, etc.) which upon exposure to heat (preferably less than about 300° C., more preferably less than about 250° C.) generates or liberates $N_2$ gas.

DETAILED DESCRIPTION OF THE INVENTION

The substrate may be any substance upon which the electrically-conductive particle layer may be coated to prepare the donor. Preferably, the substrate is transparent (at least transmissive) to the wavelength of light used to induce the transfer of the electrically-conductive particles to the receptor. Possible substrates include glass, polymer film, and the like. Possible polymeric substrates include polyester base (e.g., polyethylene terephthalate, polyethylene naphthalate), polycarbonate resins, polyolefin resins, polyvinyl resins (e.g., polyethylene, polypropylene, polyvinyl chloride, polyvinylidene chloride, polyvinyl acetals, and copolymers thereof), hydrolyzed and unhydrolyzed cellulose ester bases (e.g., cellulose triacetate, cellulose acetate), and other conventional polymeric films used as supports in various imaging arts. Transparent polymeric film bases with thicknesses ranging from 4 to 250 microns are preferred. Typical examples of these are those derived from polymers containing repeating, interpolymerized units derived from 9,9-bis-(4-hydroxyphenyl)-fluorene and isophthalic acid, terephthalic acid or mixtures thereof, the polymer being sufficiently low in oligomer (i.e., chemical species having molecular weights of about 8000 or less) content to allow formation of a uniform film. This polymer has been disclosed as one component in a thermal transfer receiving element in U.S. Pat. No. 5,318,938. In the laser-induced thermal transfer process, the donor substrate is preferably transparent polyethylene terephthalate (PET). In the flash lamp-induced thermal transfer process, the donor substrate is preferably a UV transparent material such as polypropylene.

Any electrically-conductive material can be used to make the particles used in the present invention. For example, the electrically-conductive particles can be produced by any possible method from metals such as nickel, stainless steel, chromium, cobalt, aluminum, antimony, copper, silver, platinum, palladium, and gold and alloys and oxides of these metals. The above materials may be used alone or in combination. It is also possible to use metal-coated particles of non-conductive materials such as, for example, glass and plastics.

Electrically-conductive particles used in the present invention preferably have a diameter of from 0.01 to 10 microns. Preferably, the particles themselves behave both as conductive elements and as black body absorbers. Alternatively, larger conductive particles could be mixed with conductive or non-conductive black body absorbers. The particles are contained in the binder component in an amount of about 40 to 60% by volume. The maximum practical particle size is determined by the transfer process. More preferably, the electrically-conductive particles have a diameter of from 0.05 to 2 microns and, most preferably, 0.1 to 1 micron. The shape and diameter of the particles can be measured by any method known to those skilled in the art such, for example, by electron microscopy.

The particles are generally dispersed in a suitable organic binder. In the laser-induced thermal transfer process, the organic binder that is utilized is preferably one that exhibits suitable physical properties for transfer of thin films. For example, it is preferred that the imaged area readily releases from the surrounding unimaged area and transfers completely to the receptor surface. Preferably, the binder is similar enough to the adhesive material to be used such that there will be a chemical and physical compatibility within the resultant Z-axis adhesive. In the case of thermosetting adhesives, it is preferable to exclude any catalysts or curatives from the binder formulation.

The binder in which the electrically-conductive particles are dispersed may consist of any thermoplastic polymer, thermosetting resin, or suitable mixture thereof which meets the above-disclosed description. The particular binders chosen will depend upon the type of application the end-user desires. Non-limiting examples of thermoplastic polymers are poly(methyl methacrylate), nitrocellulose, ethylene-vinyl acetate copolymer, polyethylene, ethylene-propylene copolymer, ethylene-acrylate copolymer, acrylic rubber, polyisobutylene, atactic polypropylene, poly(vinyl butyral), styrene-butadiene, polybutadiene, ethylcellulose, polyamides, polyurethanes, and polychloroprene. Non-limiting examples of thermosetting resins are epoxy resins, phenoxy resins, cyanate ester resins, and the like.

In the flash lamp-induced thermal transfer, gas-producing polymers are often used as binders. The heating of the binder during the flash lamp exposure causes a partial or total decomposition of the gas-producing polymer. The resultant gas serves to propel the particles from the donor to the receptor. Generally, the gas-producing polymer should have a thermally available nitrogen content greater than about 10 weight percent, preferably greater than about 20 weight percent, and more preferably greater than about 30 weight percent.

The gas-producing polymer may be any polymer that liberates nitrogen gas ($N_2$) when heated rapidly, such as, for example, by exposure to an infrared laser beam. Polymers that liberate nitrogen gas on heating generally have thermally decomposable functional groups. Non-limiting examples of suitable thermally decomposable functional groups include azido, alkylazo, diazo, diazonium, diazirino, nitro, nitrato, triazole, etc. The thermally decomposable groups may be incorporated into the gas-producing polymer either prior to polymerization or by modification of an existing polymer, such as, for example, by diazotization of an aromatic amine (e.g., with nitrous acid) or diazo transfer with tosyl azide onto an amine or β-diketone in the presence of triethylamine.

In one preferred embodiment, the azide-containing polymer used as one of the reactants has the following formula:

 (I)

wherein:

X represents a hydroxyl, azide, mercapto, or amino (including mono-alkyl and aryl-substituted amino) group and preferably, X is an azide or a hydroxyl group.

R represents a divalent monomer group, containing a $N_3$ group, derived from a cyclic ether such as, for example, —$CH_2CH(CH_2N_3)O$—, —$CH_2C(CH_3)(CH_2N_3)CH_2O$—, —$CH(CH_2N_3)CH_2O$—, —$CH_2C(CH_2N_3)_2CH_2O$—, —$CH(CH_2N_3)CH(CH_2N_3)O$—, and —$CH_2CH(N_3)CH_2O$—; a cyclic sulfide such as, for example, —$CH_2CH(CH_2N_3)S$—, —$CH_2C(CH_2N_3)_2CH_2S$—, —$CH(CH_2N_3)CH(CH_2N_3)S$—, and —$CH_2CH(N_3)CH_2S$—; and a cyclic amine such as, for example, —$CH_2CH(CH_2N_3)NR^1$—, —$CH(CH_2N_3)CH_2NR^1$—, —$CH_2C(CH_2N_3)_2CH_2NR^1$—, —$CH(CH_2N_3)CH(CH_2N_3)NR^1$—, and —$CH_2CH(N_3)CH_2NR^1$—;

$R^1$ represents a hydrocarbyl group (e.g., alkyl, aryl, aralkyl, alkaryl, etc.);

L represents a mono-, di-, tri- or tetra-valent alkyl radical. Non-limiting examples of monovalent radicals are methyl and ethyl. Non-limiting examples of polyvalent alkyl radicals are ethylene, methylene, propylene, 1,2,3-propanetriyl, 2-ethyl-2-methylene-1,3-propanediyl, 2,2-dimethylene-1,3-propanediyl, etc. Preferably, L is 2-ethyl-2-methylene-1,3-propanediyl;

corresponding to L, m represents 1, 2, 3, or 4; and n represents any positive integer greater than 1, preferably greater than 5, more preferably greater than 10.

The foregoing azide-containing polymer of Formula (I) can be made by procedures well known to those skilled in the art of synthetic organic chemistry such as disclosed, for example, in U.S. Pat. Nos. 3,645,917 and 4,879,419, the disclosures of which are incorporated herein by reference.

The foregoing azide-containing polymer of Formula (I) has a low halogen content to ensure that the polymer has the desired stability properties. The low halogen content is generally accomplished by choosing reaction conditions and catalysts to ensure the quantitative conversion to azide of the halogen functionality in the polymer precursor. The term "low halogen content" means that the polymer has less than 2 weight percent halogen. More preferably the polymer has less than 1 weight percent halogen, and most preferably less than 0.5 weight percent halogen. The term halogen refers to chlorine, bromine, or iodine covalently bound to a carbon atom of the polymer.

One or more crosslinking agents may be employed in combination with the azide-containing polymer of Formula I to provide coatings having improved strength. The choice of an appropriate crosslinking agent depends on the functional groups on the azide-containing polymer. For instance, if hydroxyl groups are present on the azide-containing polymer, then crosslinking agents for polyols could be employed (e.g., isocyanates).

Preferably, a crosslinking agent for polyols is employed in combination with an azide-containing polymer having multiple hydroxyl end groups. Preferred crosslinking agents in this case are polyisocyanates, including but not limited to, hexamethylene diisocyanate; diphenylmethane diisoeyanate; bis(4-isocyanatocyclohexyl)methane, 2,4-toluene diisocyanate, etc.

In another preferred embodiment, the azide-containing polymer used as one of the reactants has recurring units of the following formula:

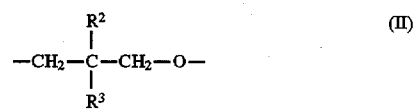 (II)

wherein: either $R^2$ or $R^3$ or both each independently represent an $N_3$-containing group. An example of a preferred azide group is —$CH_2N_3$.

The azide-containing polymer of Formula (II) can be made by procedures well known to those skilled in the art of synthetic organic chemistry such as disclosed, for example, in U.S. Pat. No. 3,694,383, the disclosure of which is incorporated herein by reference.

In another preferred embodiment, energetic copolymers are utilized as reactants having repeating units derived from different monomers, one or more of which have $N_3$ groups. Preferably the monomers are cyclic oxides having three to six ring atoms. Copolymerization of the monomers is preferably carried out by cationic polymerization. The foregoing copolymers and their method of preparation are disclosed in U.S. Pat. No. 4,483,978, the disclosure of which is incorporated herein by reference.

To improve speed of the radiation induced thermal transfer of the electrically-conductive particles to the receptor utilized in the present invention, one or more accelerators for azide decomposition may be added to the binder layer or a layer adjacent thereto. For azide-containing polymers, useful accelerators include those materials known in the art to reduce the decomposition temperature of alkyl azide compounds including, but not limited to, metal complexes such as ferrous acetylacetonate, stannous chloride, magnesium chloride, ferric chloride, zinc bromide, etc.; protic acids such as benzoic acid, acetic acid, p-toluenesulfonic acid, etc.; thermally sensitive free-radical initiators such as benzoyl peroxide, t-butyl perbenzoate, etc.; phosphines such as triphenylphosphine; and the like.

The electrically-conductive particles can be dispersed in the binder by any suitable method. For example, the binder and other additives, if utilized, can be dissolved in a solvent or fused to liquid form and then mixed with the electrically-conductive particles by methods including mixing, milling, stirring, and sonication (e.g., in an ultrasonic water bath). Dispersing agents are sometimes utilized in order to help disperse the particles in the binder. Typically coupling agents (e.g., silanes, titanates, and zirconates) are used as dispersing agents. In particular, Disperbyk™ 161 (available from Byk-Chemie USA, Wallingford, Conn.) has been found to be a useful dispersing agent.

The above-disclosed electrically-conductive composition can then be coated on a variety of substrates disclosed earlier herein such as transparent PET, to the desired thickness using any conventional coating technique (e.g., extrusion coating, knife coating, bar coating, gravure coating, etc.). The desired thickness of the layer is determined by considering the relation of the diameter of the particles used and the characteristics of the substrate onto which the binder is coated. Typically, the dry thickness of the electrically-conductive particle containing layer ranges from 0.1 to 10 microns. Preferably, the electrically-conductive particle containing layer is 1–2 microns in (dry) thickness.

The receptor may comprise an adhesive layer on a support, or alternatively, an adhesive layer may be applied (e.g., coated, extruded, laminated, etc.) to the surface of the receptor bearing the patterns of electrically-conductive particles after the particles have been thermally transferred to the receptor. In the latter case, it is possible for the receptor to be one of the electrode containing materials to be bonded by the Z-axis adhesive, whereby a pattern of electrically-conductive particles is thermally transferred directly to the surface of the electrode followed by the application of an adhesive layer to the electrode surface. The resulting Z-axis conductive adhesive can then be used to bond the attached electrode to a second electrode surface.

The adhesive layer may consist of any thermoplastic polymer, thermosetting resin, or suitable mixture thereof which meets the above-disclosed description. The particular polymers and/or resins chosen will depend on the type of application the end-user desires. In addition, curatives, catalysts, and other additives may be present. Non-limiting examples of thermoplastics are poly(methyl methacrylate), nitrocellulose, ethylene-vinyl acetate copolymer, polyethylene, ethylene-propylene copolymer, ethylene-acrylate copolymer, acrylic rubber, polyisobutylene, atactic polypropylene, poly(vinyl butyral), styrene-butadiene, polybutadiene, ethylcellulose, polyamides, polyurethanes, and polychloroprene. Non-limiting examples of thermosetting resins are epoxy resins, phenoxy resins, cyanate ester resins, and the like.

The adhesive layer may be coated from a solution in solvents such as MEK. However, for situations where it is advantageous to limit the use of solvents, the adhesive layer may also be coated from water using latex emulsions. Suitable commercially available emulsions include Reichhold 40428-10 acrylic emulsion and Reichhold 40148-00 vinyl acrylic emulsion (available from Reichhold Chemicals, Inc., Research Triangle Park, N.C.) and Dynacolla™6083 polyester (available from Hüls America, Inc., Piscataway, N.J.). Alternatively, the adhesive film or the adhesive film on a release liner may be laminated to the desired surface.

The adhesive layer may be applied to any convenient material such as a sheet, film, or flexible carrier web. In one embodiment, the adhesive is applied to a material from which it can be readily removed when the adhesive is to be used. Such a material is frequently known in the art as a release liner. By release liner is meant any material from which the adhesive can be readily removed intact as a film. Typical release liners include polymer films, treated or untreated paper, glass, metal, etc. The release liner may also be coated or treated with a release agent such as a silicone or fluorochemical surface treatment. Biaxially oriented polypropylene is a preferred release liner.

In another embodiment, the adhesive may be coated directly on, transferred to, or otherwise adhered directly to an electrode, circuit board, etc. This electrode then becomes one of the electrode containing materials to be bonded by the adhesive after the electrically-conductive particles are imagewise transferred to the adhesive by the process of this invention.

A donor element of the present invention may be used by placing it in intimate contact (e.g., vacuum hold-down) with an adhesive (e.g., thermoplastic, thermosetting, or mixtures thereof, sometimes coated onto a release liner) and imagewise exposing the donor element to electromagnetic radiation under conditions sufficient to thermally transfer the electrically-conductive particles of the donor element to the adhesive in a patterned fashion such that when the adhesive is used to bond facing electrodes, the resulting patterned adhesive is a Z-axis conductor between facing electrodes, yet is electrically insulating between two adjacent electrodes.

Alternately, a donor element of the present invention may be used by placing it in intimate contact (e.g., vacuum hold-down) with a receptor and imagewise exposing the donor element to electromagnetic radiation under conditions sufficient to thermally transfer the electrically-conductive particles of the donor element to the receptor in a patterned fashion, followed by applying an adhesive (e.g., thermoplastic, thermosetting, or mixtures thereof, sometimes coated onto a release liner) to the receptor surface, such that when the adhesive is used to bond facing electrodes, the resulting patterned adhesive is a Z-axis conductor between facing electrodes, yet is electrically insulating between two adjacent electrodes.

A variety of lasers such as excimer lasers, gas lasers (e.g., argon-ion, krypton-ion, etc.), $CO_2$ lasers, diode lasers, and solid state lasers (e.g., Nd:YAG, Nd:YLF, Nd:Glass, etc.) may be used as a source of the electromagnetic radiation to induce the thermal transfer of the electrically-conductive particles to the receptor. Preferred lasers typically have output powers greater than 100 mW. Lasers emitting a variety of wavelengths may be used in the present invention, including ultra-violet, visible, and infra-red lasers (i.e., wavelengths from 190–10,600 nm). The preferred lasers for use in this invention include continuous-wave high power (>100 mW) laser diodes, fiber coupled laser diodes, laser diode arrays, and lamp or diode pumped solid-state lasers, with the solid-state lasers (e.g. diode or diode-pumped) being most preferred. With continuous-wave lasers, the exposure dwell time should be in the range of 0.1 to 50 microseconds, with 0.1 to 10 microseconds preferred. Alternatively, a pulsed laser (such as a Q-switched Nd:YAG) may be utilized, in which case the dwell time is the same as the pulse width, which is typically on the order of 1–10 nanoseconds. Laser fluences are usually on the order of 0.1–5 $J/cm^2$.

Flash lamps such as xenon flash lamps provide a momentary intense burst of radiation. A xenon flash lamp produces a broad spectrum of bluish white light in a flash of about 2 to 3 milliseconds in duration as described in U.S. Pat. No. 3,914,775. The flash from a xenon flash lamp will provide an amount of radiant energy which is dependent on the electrical energy input from its power supply. The efficiency of the irradiation means in converting energy input to a xenon lamp to radiant flux density received by the material being irradiated is, among other factors, dependent upon the configuration of the lamp, the spacing of the lamp from the material, and the efficiency and configuration of the reflector used in the lamp.

The electromagnetic radiation source is used to imagewise irradiate the donor containing the electrically-conductive particles, inducing the thermal transfer of the layer containing the particles to the receptor in the desired pattern. The imagewise exposure may be carried out in any convenient manner as desired. However, in the case of lasers, the imagewise exposure is generally either made by using masks or by directly digitally addressing the laser. Preferably, the laser is digitally addressed and is capable of writing an arbitrary pattern of particles on the adhesive receptor. In this case, the pattern can easily be designed to match the pads of a flipchip. In the case of flash lamps, the imagewise exposure is generally made either by using masks or by focusing the flash with a microlens array.

Masks may be prepared by conventional methods known in the art such as through the use of a photoresist/etching process. The mask is usually made of a material that reflects the incident radiation, and can be coated or deposited on a flexible or a rigid substrate. Materials commonly used to reflect the incident radiation include chrome and/or chrome oxide.

The use of microlens arrays to prepare the patterned adhesive is amenable to commercial production of a fixed grid patterned Z-axis adhesive. Microlens arrays may be fabricated by the well-known method of compression molding of optical thermoplastics such as polycarbonate and poly(methyl methacrylate), PMMA, as described in U.S. Pat. No. 5,300,263. When a flash lamp is used, the binder used in the donor element should be one which evolves nitrogen gas upon heating. Examples of such binders are disclosed earlier herein.

The particular image used to create the pattern of transferred electrically-conductive particles on the receptor will depend on the layout of the electrode containing materials to be bonded. It is frequently useful to create an image comprising a grid of solid dots (i.e, a grid array), with each dot representing an area where the electrically-conductive particles will be transferred to the receptor. The shape of the dots may be any geometric shape (e.g., circular, oval, square, rectangular, etc.) that is convenient. The size of the dots are chosen to be smaller than the size of the bonding pad of the electrode containing material to be bonded. Upon transfer of the electrically-conductive particles to the receptor, a plurality of dots of electrically-conductive particles under each bonding pad site is created. The use of the grid array pattern results in the loosening of the precise alignment requirements of the electrode containing materials to be bonded.

For example, to bond a semiconductor chip with bonding pads around the perimeter of the chip to a flexible circuit board, it is convenient to use a "perimeter grid" image to transfer a "perimeter grid" pattern of electrically-conductive particles to the receptor. The "perimeter grid" pattern comprises dots of the electrically-conductive particles in areas of the adhesive which will be covered by the bonding pads which are typically located around the perimeter of the semiconductor chip. A typical pattern might consist of 2×2 mil square dots on a 3 mil pitch. The advantage of this pattern is that while a plurality of dots comprising electrically-conductive particles are transferred to the receptor in areas where each of the bonding pads of the chip will be placed, extraneous particles are not transferred to the receptor in areas which will be either under the center of the chip or outside the area where the chip is to be bonded. Elimination of electrically-conductive particles in these locations reduces the chance of accidental shorting. In addition, the precise alignment requirements of the exact pad pattern are somewhat loosened. Other useful patterns will be apparent to the practitioner of this invention depending on the layout of the specific electrode containing substrates to be bonded.

After the radiation induced thermal transfer of the layer containing electrically-conductive particles from the donor element to the receptor, a pattern of particles is created on the receptor, and the donor element may be removed from the receptor.

The patterned adhesive containing the electrically-conductive particles can then be used to bond together a plurality of facing electrodes and the like so as to establish electrical conductivity between a variety of different materials. For example, after the release liner is removed if present, the patterned adhesive containing the electrically-conductive particles can be used to electrically connect the bonding pads of a semiconductor and a flexible printed circuit board. This method can be used to electrically connect a variety of electrode surfaces to one another, including, but not limited to, flat panel displays to flexible circuit boards, flexible circuit boards to flexible circuit boards, flexible circuit boards to semiconductor chips, and semiconductor chips to flat panel displays.

The following non-limiting examples further illustrate the present invention.

EXAMPLES

The materials employed below were obtained from Aldrich Chemical Co. (Milwaukee, Wis.) unless otherwise specified. The term "MEK" refers to methyl ethyl ketone. Ultrafine (submicron) metals (e.g., ultrafine tin, ultrafine palladium, ultrafine nickel, etc.) are commercially available and were either purchased from Nanophase Technologies Corporation (Darien, Ill.) or supplied as samples from Mitsubishi International Corporation (Chicago, Ill.).

Internal Drum System

Imaging was performed using a flash lamp pumped Nd:YAG laser operating at 1.06 microns in the TEM00 mode, focused to a 26 micron spot (measured at the $1/e^2$ intensity level), with 3.4 Watts incident at the image plane. Scanning of the laser was accomplished using a single facet 45 degree mirror, mounted on an air-bearing motor. The mirror was centered on the axis of a 135 degree internal drum, which served as the image plane. During imaging, the image plane was translated synchronously perpendicular to the laser scan direction. Imagewise exposure was provided by digital modulation of the laser via an acousto-optic modulator, utlizing the first diffracted order from the modulator.

Preparation of Energetic Polymer Solution: polyBAMO-10MA

PolyBAMO (poly[bis(azidomethyl)oxetane]), molecular weight (MW) of 4,500 Daltons as determined by gel permeation chromatography, was obtained from Aerojet Corporation. 180 g of polyBAMO solution (25 wt % in MEEK, 45 g polyBAMO), 5 g of maleic acid, and 315 g of MEK were heated in a sealed jar for 4 hrs. at 60° C. The slightly yellow solution of polyBAMO-10MA was cooled to room temperature and used directly for dispersion preparation.

Preparation of the polyBAMO-10MA Tin Donor Element (Sample A)

A Branson ultrasonic cleaning bath was used to disperse 50 mg of ultrafine tin in 1 g of polyBAMO-10MA (10 wt % in MEK) containing 50 mg of Disperbyk®161 dispersant solution (10 wt % in MEK). The dispersion was sonicated for 2 minutes in an ultrasonic water bath and then coated onto plain 4 mil polyethylene terephthalate (PET) using a #8 Meyer bar.

Preparation of the PMMA Tin Donor Element (Sample B)

A Branson ultrasonic cleaning bath was used to disperse 50 mg of ultrafine tin in a solution containing 100 mg of poly(methyl methacrylate) (PMMA, Polysciences, Inc.; MW 75,000 Daltons), 900 mg MEK, and 50 mg of Disperbyk® 161 dispersant solution (10 wt % in MEK). The dispersion was sonicated for 2 minutes in an ultrasonic water bath and then coated onto plain 4 mil PET using #8 Meyer bar.

Preparation of the PMMA Palladium Donor Element (Sample C)

A Branson ultrasonic cleaning bath was used to disperse 50 mg of ultrafine palladium in a solution containing 100 mg of PMMA (Polysciences, Inc.; MW 75,000 Daltons), 900 mg MEK, and 50 mg of Disperbyk® 161 dispersant solution (10 wt % in MEK). The dispersion was sonicated for 2 minutes in an ultrasonic water bath and then coated onto plain 4 mil PET using a #8 Meyer bar.

Preparation of Nickel Donor Element (Sample D)

A nickel donor element was prepared using an adhesive binder. The adhesive contained B30 cyanate ester (available from Ciba Geigy) and poly(vinyl butyral) (available from Sekisui Chemical Co.) in a 1:1 ratio, a silane coupling agent, and a catalyst and was prepared in accordance with the procedure of Example 1 of U.S. Pat. No. 5,143,785, the disclosure of which is hereby incorporated by reference. A Branson ultrasonic cleaning bath was used to disperse 400 mg of ultrafine nickel in a solution containing 400 mg of the adhesive binder and 3.6 g MEK. The dispersion was sonicated for 10 minutes in an ultrasonic water bath and then coated onto plain 4 mil PET using a #4 Meyer bar.

Preparation of Adhesive-Release Liner Receptor Constructions

The receptors were prepared using an adhesive containing B30 cyanate ester (available from Ciba-Geigy) and poly(vinyl butyral) (available from Sekisui Chemical Co.) in a 1:1 ratio, a silane coupling agent, and a catalyst and was prepared in accordance with the procedure of Example 1 of U.S. Pat. No. 5,143,785, the disclosure of which is hereby incorporated by reference. Solutions of the above adhesive in MEK were coated on biaxially oriented polypropylene at dry thicknesses ranging from 0.2 to 1.3 mils. The constructions were used directly after air drying.

Microlens Arrays

Two different microlens arrays were used in the experiments. The stamper for the compression molding was a replica of the original tooling, which was fabricated according to the method of U.S. Pat. No. 5,300,263.

Microlens A was constructed as an array of spherical lenses, each with a rectangular cross-section 0.33×0.11 mm, and was compression molded in 0.007 in. thick polycarbonate at 170° C. and 500 psi for 5 minutes. Microlens B was constructed as an array of spherical lenses, each of square 0.356 mm cross-section, and was compression molded in 0.007 in. thick polycarbonate at 180° C. and 300 psi for 3 minutes. The focal lengths in air of both Microlens A and B were approximately 1 mm.

Electrical Testing of Bonded Interconnects

A device was used to measure the resistance of a 3M DX 120 chip bonded to flex. A 4-wire measurement was recorded based on the principles described in ASTM B 539-90 such that resistance not due to interconnects was minimized to approximately 1 milli Ohm. A daisy chain measurement which represents the resistance across all the interconnects of a given side of the chip was also recorded. Resistance values greater than 100 ohms for the 4-wire test and greater than 500 ohms for the daisy chain test were arbitrarily recorded as disconnects (Dis.) and the number of disconnects (#Dis.) was reported for each test. The range of resistance values recorded ("Resistance", in ohms) for the interconnects (Int.) along with the number of interconnects (#Int.) were reported for each test. Initial results were recorded for all samples as well as results after aging (in hours) under humidity (85° C., 85% Relative Humidity) and temperature cycling (−55° to 125° C., 1 hr. ramp in both directions, 1 hr. soak at both temperatures) conditions for many of the samples.

Flex Circuit Coupon Description

The substrate was an adhesiveless circuit lamination comprised of a 50 micron thick polyimide film and 10 micron thick copper circuit traces. Each circuit trace was coated with approximately 0.76 mm (30 microinch) of electroplated gold. The circuit was designed to accommodate a 3M D120×test chip in a flipchip interconnection mode. The 3M D120×test chips were 6.7×6.7 mm square and contained 120 interconnection pads around the periphery. The interconnection pads were 100×100 microns in size and were uniformly distributed on 200 micron center to center spacing with 30 pads on each side of the chips. The circuits on the chips and substrates were designed to permit accurate, 4-point resistance measurements on 40 individual pads. Of the remaining 82 pads, 80 were tied together in series in separate daisy chain circuits. The two circuits were interleaved to permit testing for short circuits between adjacent pads.

Example 1

Microlens A, the donor element described above as Sample A, and the adhesive-release liner construction were placed in intimate contact with the electrically-conductive particle containing layer of the donor against the adhesive side of the receptor (1.3 mil adhesive thickness), and then exposed with a xenon flash lamp using a 3M ProMat flash lamp device through the microlens array. The components were separated after exposure. Micrographs of the receptor indicated that the flash lamp had induced a pattern of particles of tin to transfer to the adhesive in the 0.33×0.11 mm pitch pattern of the microlens. The patterned adhesive layer was removed from its backing and used to bond flex circuits (16 mil pitch, ¼ oz. Cu, Au plated) to Indium-Tin Oxide (ITO) coated glass. Normal bonding conditions (180° C. adhesive temp., 20 seconds, and 400 psi) were used. The 4-wire test results were then recorded:

| Humidity Aging | | | | Temperature Cycling | | | |
|---|---|---|---|---|---|---|---|
| Time (hrs.) | #Int. | Resistance (Ohm) | #Dis. | Time (hrs.) | #Int. | Resistance (Ohm) | #Dis. |
| 0 | 15 | 0.366–0.453 | 0 | 0 | 15 | 0.336–0.413 | 0 |
| 1080 | 15 | 0.621–1.854 | 0 | 1080 | 15 | 1.509–4.388 | 0 |

Example 2

Example 1 was repeated, except a 0.9 mil thick adhesive was used as the receptor. The 4-wire test results were then recorded:

| Humidity Aging | | | | Temperature Cycling | | | |
|---|---|---|---|---|---|---|---|
| Time (hrs.) | #Int. | Resistance (Ohm) | #Dis. | Time (hrs.) | #Int. | Resistance (Ohm) | #Dis. |
| 0 | 15 | 0.318–0.477 | 0 | 0 | 15 | 0.331–0.433 | 0 |
| 1080 | 15 | 0.526–5.018 | 0 | 1080 | 15 | 1.472–6.804 | 0 |

Example 3

The procedure of Example 1 was repeated using 1.3 mil thick adhesive as the receptor, except that Microlens B was used in place of Microlens A. The resultant tin particle pattern exhibited the 0.356×0.356 mm pitch pattern of the microlens. The 4-wire test results were then recorded:

| Humidity Aging | | | | Temperature Cycling | | | |
|---|---|---|---|---|---|---|---|
| Time (hrs.) | #Int. | Resistance (Ohm) | #Dis. | Time (hrs.) | #Int. | Resistance (Ohm) | #Dis. |
| 0 | 15 | 0.362–0.433 | 0 | 0 | 15 | 0.364–0.453 | 0 |
| 1080 | 15 | 0.627–1.674 | 0 | 1080 | 15 | 1.720–4.740 | 0 |

Example 4

Example 3 was repeated, except a 0.9 mil thick adhesive was used as the receptor. The 4-wire test results were then recorded:

| Humidity Aging | | | | Temperature Cycling | | | |
|---|---|---|---|---|---|---|---|
| Time (hrs.) | #Int. | Resistance (Ohm) | #Dis. | Time (hrs.) | #Int. | Resistance (Ohm) | #Dis. |
| 0 | 15 | 0.326–0.423 | 0 | 0 | 15 | 0.334–0.420 | 0 |
| 1080 | 15 | 0.528–2.158 | 0 | 1080 | 15 | 1.307–6.945 | 0 |

Example 5

A 1.0 mil adhesive-release liner receptor construction was placed in the curved focal plane surface (internal drum) of the laser imager with the release liner surface contacting the drum. The PMMA tin donor (Sample B) was placed in contact with the receptor so that the electrically-conductive metal containing layer of the donor was in contact with the adhesive. The laser was scanned over the donor to induce the transfer of the electrically-conductive particle layer and create a series of rectangular patches on the receptor containing tin particles. The patches were approximately 100× 200 microns in dimension. The patterned adhesive layer was removed from its backing and used to bond flex circuits (16 mil pitch, ¼ oz. Cu, Au plated) to ITO coated glass. Normal bonding conditions (180° C. adhesive temp., 20 seconds, 400 psi) were used for bonding.

Example 6

The procedure of Example 5 was repeated except that the donor element described above as Sample A was used in place of Sample B during the process. The laser was scanned over the donor to induce the transfer of a series of rectangular patches containing tin particles to the receptor. The patches were approximately 100×200 microns in dimension. The patterned adhesive layer was removed from its backing and used to bond flex circuits (16 mil pitch, ¼ oz. Cu, Au plated) to ITO coated glass. Normal bonding conditions (180° C. adhesive temp., 20 seconds, 400 psi) were used for bonding.

Example 7

The procedure of Example 5 was repeated except that the donor element described above as Sample C was used instead of Sample B and the receptor was plain 4 mil PET instead of the adhesive. The laser was scanned over the donor to create a series of rectangular patches containing palladium particles. The patches were approximately 100× 200 microns in dimension.

Example 8

A 0.2 mil adhesive-release liner receptor construction was placed in the curved focal plane surface (internal drum) of the laser imager with the release liner surface contacting the drum. The nickel donor (Sample D) was placed in contact with the receptor so that the electrically-conductive metal containing layer of the donor was in contact with the adhesive. The laser was scanned over the donor to induce the transfer of the electrically-conductive particle layer and create a perimeter pattern of square patches on the receptor containing nickel particles. The patches were approximately 2×2 mil in dimension with 1 mil spacing and patterned to nominally match the pad positions on the chip. The patterned adhesive layer was removed from its backing and used to bond a flex circuit coupon as described above to a 3M DX 120 (unbumped) test chip positioned so that each side of the chip was in contact with one side of the perimeter grid of particles. Normal bonding conditions (180° C. adhesive temp., 20 seconds, and 100 psi) were used. The electrical testing procedure described above gave the following original and aged (thermal cycling) results:

| | Daisy Chain Test | | | 4-Wire Test | | |
|---|---|---|---|---|---|---|
| Aging (hrs.) | #Int. | Resistance (Ohm) | #Dis. | #Int. | Resistance (Ohm) | #Dis. |
| 0 | 4 | 4.0–8.1 | 0 | 40 | 0.019–2.904 | 0 |
| 211 | 4 | 25.1–59.9 | 0 | 40 | 0.315–7.203 | 0 |
| 529 | 4 | 75.4–290.2 | 0 | 40 | 0.226–39.845 | 0 |

Example 9

The procedure of Example 8 was repeated except that 0.4 mil adhesive receptor was used. The electrical testing procedure described above gave the following original and aged (thermal cycling) results:

| | Daisy Chain Test | | | 4-Wire Test | | |
|---|---|---|---|---|---|---|
| Aging (hrs.) | #Int. | Resistance (Ohm) | #Dis. | #Int. | Resistance (Ohm) | #Dis. |
| 0 | 4 | 2.9–11.9 | 0 | 40 | 0.015–2.761 | 0 |
| 211 | 3 | 17.5–56.2 | 1 | 40 | 0.141–9.274 | 0 |
| 527 | 3 | 28.9–96.1 | 1 | 40 | 0.142–8.240 | 0 |

Example 10

The procedure of Example 8 was repeated using 0.6 mil adhesive receptor, except that a bumped chip was used. The electrical testing procedure described above gave the following original and aged (thermal cycling) results:

| | Daisy Chain Test | | | 4-Wire Test | | |
|---|---|---|---|---|---|---|
| Aging (hrs.) | #Int. | Resistance (Ohm) | #Dis. | #Int. | Resistance (Ohm) | #Dis. |
| 0 | 4 | 2.1–2.5 | 0 | 40 | 0.003–0.485 | 0 |
| 211 | 4 | 2.1–3.5 | 0 | 40 | 0.003–0.482 | 0 |
| 547 | 4 | 2.2–4.3 | 0 | 40 | 0.003–0.486 | 0 |

Example 11 (Comparative Example)

The procedure of Example 10 was repeated except that a 0.6 mil adhesive receptor without particles was used. The electrical testing procedure described above gave the following original and aged (thermal cycling) results:

| Aging (hrs.) | Daisy Chain Test | | | 4-Wire Test | | |
|---|---|---|---|---|---|---|
| | #Int. | Resistance (Ohm) | #Dis. | #Int. | Resistance (Ohm) | #Dis. |
| 0 | 4 | 2.2–2.6 | 0 | 40 | 0.004–0.481 | 0 |
| 218 | 4 | 2.3–3.8 | 0 | 38 | 0.004–0.483 | 2 |
| 547 | 4 | 2.3–4.3 | 0 | 38 | 0.000–0.483 | 2 |

Example 12

Receptors were prepared by casting solutions (50% solids in MEK) of unloaded adhesive (prepared accoding to the procedure of Example 1 in U.S. Pat. No. 5,143,785) onto silicone treated release liners to give dry film thicknesses of 0.4 and 0.7 mils. The adhesive and liner were cut into squares of approximately 1 cm$^2$. The adhesive was laminated to a flex coupon as described above by heating on a hotplate at 75° C. The adhesive coverage was over the chip bonding site and slightly larger than the size of the chip itself. Prior to imaging of the particles, the release liner was removed.

The nickel donor (Sample D) was placed in contact with the receptor so that the electrically-conductive metal containing layer of the donor was in contact with the adhesive. The laser was scanned over the donor to induce the transfer of the electrically-conductive particle layer and create a perimeter pattern of rectangular patches on the receptor containing nickel particles. The patches were approximately 2×2 mil in dimension with 1 mil spacing. Normal bonding conditions (180° C. adhesive temp., 20 seconds, and 100 psi) were used to bond a 3M DX 120 (unbumped) test chip to the adhesive to establish electrical interconnection to the flex circuit.

Example 13

Adhesive films on release liners were prepared by casting solutions (50% solids in MEK) of unloaded adhesive (prepared according to the procedure of Example 1 of U.S. Pat. No. 5,143,785) onto silicone treated release liners to give dry film thicknesses of 0.4 and 0.7 mils. The adhesive and liner were cut into squares of approximately 1 cm$^2$.

The nickel donor (Sample D) was placed in contact with a flex circuit coupon as described above (which had not been laminated with an adhesive layer) so that the electrically-conductive metal-containing layer of the donor was in contact with the flex. The laser was scanned over the donor to induce the transfer of the electrically-conductive particle layer and create a perimeter pattern of rectangular patches on the flex containing nickel particles. The patches were approximately 2×2 mil in dimension with 1 mil spacing. An adhesive square was laminated to the flex substrate surface containing the conductive particles by heating on a hotplate at 75° C. The adhesive coverage was over the chip bonding site and slightly larger than the size of the chip itself. Prior to bonding a chip, the release liner was removed. Normal bonding conditions (180° C. adhesive temp., 20 seconds, and 100 psi) were used to bond a 3M DX 120 (unbumped) test chip to the adhesive to establish electrical interconnection to the flex circuit.

Example 14

A 1.0 mil adhesive-release liner receptor construction was placed in the curved focal plane surface (internal drum) of the laser imager with the release liner surface contacting the drum. The PMMA palladium donor (Sample C) was placed in contact with the receptor so that the electrically conductive metal containing layer of the donor was in contact with the adhesive. The laser was scanned over the donor to induce the transfer of the electrically conductive particle layer and create a series of square patches on the receptor containing palladium particles. A grid of patches of approximately 2×2 mil in dimension with 1 mil spacing was produced. The patterned adhesive layer was removed from its backing and used to bond a flex circuit coupon as described above to a 3M DX 120 (unbumped) test chip. Normal bonding conditions (180° C. adhesive temp., 20 seconds, and 100 psi) were used. The electrical testing procedure described above gave the following original and aged (thermal cycling) results:

| Aging (hrs.) | Daisy Chain Test | | | 4-Wire Test | | |
|---|---|---|---|---|---|---|
| | #Int. | Resistance (Ohm) | #Dis. | #Int. | Resistance (Ohm) | #Dis. |
| 0 | 4 | 3.9–4.8 | 0 | 40 | 0.023–1.222 | 0 |
| 170 | 4 | 53.9–268.3 | 0 | 40 | 0.333–9.936 | 0 |
| 555 | 4 | 32.1–60.4 | 0 | 40 | 0.257–9.064 | 0 |
| 1172 | 4 | 48.3–227.3 | 0 | 40 | 0.314–5.023 | 0 |

Example 15 (Comparative Example)

A 1.0 mil adhesive film without particles was used to bond a flex circuit coupon as described above to a 3M DX 120 (unbumped) test chip as described in Example 14. The electrical testing procedure described above gave the following original and aged (thermal cycling) results:

| Aging (hrs.) | Daisy Chain Test | | | 4-Wire Test | | |
|---|---|---|---|---|---|---|
| | #Int. | Resistance (Ohm) | #Dis. | #Int. | Resistance (Ohm) | #Dis. |
| 0 | 3 | 5.2–8.6 | 1 | 40 | 0.1–3.1 | 0 |
| 170 | 1 | 131.4 | 3 | 33 | 0.0–94.8 | 7 |
| 555 | 1 | 115.4 | 3 | 35 | 0.0–13.4 | 5 |
| 1172 | 3 | 36.0–187.9 | 1 | 36 | 0.0–6.4 | 4 |

Example 14 clearly shows improved electrical interconnect properties using particles as compared to those recorded in Example 15 without particles.

Reasonable variations and modifications are possible from the foregoing disclosure without departing from either the spirit or scope of the present invention as defined by the claims.

What is claimed is:

1. A process for establishing electrical interconnection between two electrode-containing materials using a patterned Z-axis adhesive comprising the steps of:
   (a) providing a donor element comprising a substrate having coated thereon a layer comprising electrically-conductive particles dispersed in an organic binder;
   (b) placing said donor element in intimate contact with an adhesive receptor;
   (c) imagewise exposing said donor element to electromagnetic radiation under conditions sufficient to transfer said electrically-conductive particles from said donor element to said adhesive receptor in a patterned fashion to form the Z-axis adhesive; and
   (d) bonding together a first and a second electrode-containing material with the Z-axis adhesive.

2. The process according to claim 1 wherein said organic binder is one which evolves a gas upon heating.

3. The process according to claim 1 wherein said electrically-conductive particles are selected from the group consisting of nickel, stainless steel, chromium, cobalt, aluminum, antimony, copper, silver, platinum, palladium, gold, and alloys and oxides thereof.

4. The process according to claim 1 wherein the size of said particles is from about 0.01 to 10 microns.

5. The process according to claim 4 wherein the size of said particles is from about 0.1 to 1 microns.

6. The process according to claim 1 wherein the transferred electrically-conductive particles are arranged in a perimeter grid pattern.

7. The process according to claim 1 wherein the source of said electromagnetic radiation is a laser.

8. The process according to claim 7 wherein said laser is an excimer laser, gas laser, diode laser, or solid state laser.

9. The process according to claim 7 wherein the laser dwell time is about 0.001 to 50 microseconds and the fluence is about 0.01 to 5 $J/cm^2$.

10. The process according to claim 1 wherein the source of said electromagnetic radiation is a flash lamp.

11. The process according to claim 1 wherein said first electrode-containing material comprises a semiconductor chip.

12. The process according to claim 11 wherein the transferred electrically-conductive particles comprise a grid of dots.

13. The process according to claim 12 wherein said second electrode-containing material comprises a flexible circuit board.

14. The process according to claim 12 wherein said second electrode-containing material comprises a flat panel display.

15. The process according to claim 1 wherein the adhesive receptor comprises the first electrode-containing material.

16. A process for establishing electrical interconnection between two electrode containing materials using a patterned Z-axis adhesive comprising the steps of:

(a) providing a donor element comprising a substrate having coated thereon a layer comprising electrically-conductive particles dispersed in an organic binder;

(b) placing said donor element in intimate contact with a receptor;

(c) imagewise exposing said donor element to electromagnetic radiation under conditions sufficient to transfer said electrically-conductive particles from said donor element to said receptor in a patterned fashion;

(d) applying an adhesive layer to the surface of said receptor bearing the conductive particles to form the patterned Z-axis adhesive; and (e) bonding together a first and a second electrode-containing material with the Z-axis adhesive.

17. The process according to claim 16 wherein said organic binder is one which evolves a gas upon heating.

18. The process according to claim 16 wherein said electrically-conductive particles are selected from the group consisting of nickel, stainless steel, chromium, cobalt, aluminum, antimony, copper, silver, platinum, palladium, gold, and alloys and oxides thereof.

19. The process according to claim 16 wherein the size of said particles is from about 0.01 to 10 microns.

20. The process according to claim 19 wherein the size of said particles is from about 0.1 to 1 microns.

21. The process according to claim 16 wherein the transferred electrically-conductive particles are arranged in a perimeter grid pattern.

22. The process according to claim 16 wherein the source of said electromagnetic radiation is a laser.

23. The process according to claim 22 wherein said laser is an excimer laser, gas laser, diode laser, or solid state laser.

24. The process according to claim 22 wherein the laser dwell time is about 0.001 to 50 microseconds and the fluence is about 0.01 to 5 $J/cm^2$.

25. The process according to claim 16 wherein the source of said electromagnetic radiation is a flash lamp.

26. The process according to claim 16 wherein said first electrode-containing material comprises a semiconductor chip.

27. The process according to claim 26 wherein the transferred electrically-conductive particles comprise a grid of dots.

28. The process according to claim 27 wherein said second electrode-containing material comprises a flexible circuit board.

29. The process according to claim 27 wherein said second electrode-containing material comprises a flat panel display.

30. The process according to claim 16 wherein the receptor comprises the first electrode-containing material.

* * * * *